(12) United States Patent
Grebel et al.

(10) Patent No.: US 9,129,803 B2
(45) Date of Patent: Sep. 8, 2015

(54) GRAPHENE DEPOSITION AND GRAPHENATED SUBSTRATES

(71) Applicant: NEW JERSEY INSTITUTE OF TECHNOLOGY, Newark, NJ (US)

(72) Inventors: Haim Grebel, Livingston, NJ (US); Amrita Banerjee, Newark, NJ (US)

(73) Assignee: NEW JERSEY INSTITUTE OF TECHNOLOGY, Newark, NJ (US)

( * ) Notice: Subject to any disclaimer, the term of this patent is extended or adjusted under 35 U.S.C. 154(b) by 158 days.

(21) Appl. No.: 13/920,814

(22) Filed: Jun. 18, 2013

(65) Prior Publication Data
US 2013/0280829 A1 Oct. 24, 2013

Related U.S. Application Data

(62) Division of application No. 12/626,077, filed on Nov. 25, 2009, now Pat. No. 8,487,296.

(60) Provisional application No. 61/118,124, filed on Nov. 26, 2008.

(51) Int. Cl.
*H01L 21/332* (2006.01)
*H01L 21/02* (2006.01)
*H01L 29/16* (2006.01)
*H01L 29/66* (2006.01)
(Continued)

(52) U.S. Cl.
CPC ...... *H01L 21/02527* (2013.01); *H01L 21/0237* (2013.01); *H01L 21/02425* (2013.01); *H01L 21/02488* (2013.01); *H01L 21/02664* (2013.01); *H01L 29/16* (2013.01); *H01L 29/1606* (2013.01); *H01L 29/66742* (2013.01); *H01L 29/778* (2013.01); *H01L 29/78684* (2013.01)

(58) Field of Classification Search
CPC .................................................. H01L 29/1606
USPC ............ 257/20, E29.242, E21.483; 438/135; 977/762, 844
See application file for complete search history.

(56) References Cited

U.S. PATENT DOCUMENTS

| 6,998,634 | B2 | 2/2006 | Cheong | |
|---|---|---|---|---|
| 7,619,257 | B2 | 11/2009 | Pfeiffer | |
| 2004/0091711 | A1* | 5/2004 | Mukasa et al. | ........ 428/408 |

(Continued)

FOREIGN PATENT DOCUMENTS

JP 2008-235520 2/2008

OTHER PUBLICATIONS

Das et al.; Monitoring dopants by Raman scattering in an electrochemically top-gated graphene transistor; Nature Nanotechnology, vol. 3, Apr. 2008, pp. 210-215.

(Continued)

*Primary Examiner* — David Vu
(74) *Attorney, Agent, or Firm* — Jensen & Puntigam, PS

(57) ABSTRACT

Methods, devices, systems and/or articles related to techniques for forming a graphene film on a substrate, and the resulting graphene layers and graphenated substrates are generally disclosed. Some example techniques may be embodied as methods or processes for forming graphene. Some other example techniques may be embodied as devices employed to manipulate, treat, or otherwise process substrates, graphite, graphene and/or graphenated substrates as described herein. Graphene layers and graphenated substrates produced by the various techniques and devices provided herein are also disclosed.

21 Claims, 10 Drawing Sheets

(51) Int. Cl.
H01L 29/786 (2006.01)
H01L 29/778 (2006.01)

(56) References Cited

U.S. PATENT DOCUMENTS

| | | | |
|---|---|---|---|
| 2007/0158789 A1 | 7/2007 | Faris | |
| 2008/0063585 A1* | 3/2008 | Smalley et al. | 423/414 |
| 2008/0176058 A1 | 7/2008 | Maschmann | |
| 2009/0155561 A1 | 6/2009 | Choi | |
| 2010/0035093 A1 | 2/2010 | Ruoff | |
| 2010/0127312 A1 | 5/2010 | Grebel | |

OTHER PUBLICATIONS

Ozyilmaz et al.; Electronic Transport and Quantum Hall Effect in Bipolar Graphene p-n-p Junctions; The American Physical Society, PRL 99, Oct. 19, 2007, pp. 166804-1 to 166804-4.
Sidorov et al., Electrostatic deposition of Graphene, 2007, IOP Publishing, Nanotechnology (18), pp. 1-4.
Wilson, Electrons in Atomically Thin Carbon Sheets Behave like Massless Particles, Jan. 2006, American Institute of Physics, Physics Today, pp. 21-23.
Ferrari, A. et al., Raman Spectrum of Graphene and Graphene Layers, Nov. 2006, The American Physical Society, Physical Review Letters (97), pp. 187401-1-187401-4.
Ci et al., Crystallization behavior of the amorphous carbon nantoubes prepared by the CVD Method, Jul. 2001, Journal of Crystal Growth 233, pp. 823-828.
Lemme et al., A Graphene Field-Effect Device, 2007, IEEE Electron Device Letters, 28 (4), pp. 282-284.
Banerjee, A, and Grebel, H., "Depositing graphene films on solid and perforated substrates," Nanotechnology (2008), vol. 19, Issue:36, 5 pages.
Banerjee, A., et al., "Raman spectrum of graphene coated nanoholes," Mater. Res. Soc. Symp. Proc., (2007), 1059 KK10-2611.
Banerjee, S., et al., "Conductivity landscape of highly oriented pyrolytic graphite surfaces containing ribbons and edges," Physical Review B 72, 075418 (2005), vol. 72, Issue:7, 16 pages.
Berger, C., et al., "Ultrathin epitaxial graphite: 2D electron gas properties and a route toward graphene-based nanoelectronics," J. Phys. Chem. B, vol. 108, Issue:52, 5 pages, Oct. 7, 2004.
Eda, G., et al., "Large-area ultra thin films of reduced graphene oxide as a transparent and flexible electronic material," Nature Nanotechnology, vol. 3, pp. 270-274, May 2008.
Gilje, S., et al., "A Chemical Route to Graphene for Device Applications," Nano Letters, 2007, vol. 7, Issue:11, pp. 3394-3398.
Graf, D., "Spatially resolved Raman spectroscopy of single and few-layer grapheme," Nano Letters (2006), vol. 7, Issue: 2, 21 pages.
Graf, D., et al., "Raman imaging of graphene," Solid State Communications (2007), vol. 143, pp. 44-46.
Grebel, H., et al., "Detecting single-wall carbon nanotubes with surface-enhanced Raman scattering from metal-coated periodic structures," Chemical Physics Letters (2001), vol. 348, pp. 203-208.
Katz, D., et al., "Carbon nanotubes bridges spanning across metal electrode tips," Journal of Nanoscience and Nanotechnology (2008), vol. 8, Issue:9, pp. 4382-4386.
Li, X., et al., "Large-Area Synthesis of High-Quality and Uniform Graphene Films on Copper Foils," Sciencexpress, vol. 324, No. 5932, pp. 1312-1314, Jun. 5, 2009.
Luker, A., et al., "Band pass filters in the 1 μm spectral region: Thick metal screens," Journal of Infrared Physics Technology, vol. 51, Issue:3, pp. 178-185, 2007.
Novoselov, K.S., et al., "Electric Field Effect in Atomically Thin Carbon Films," Science, vol. 306, Issue:5696, 5 pages, 2004.
Novoselov, K.S., et al., "Two-dimensional atomic crystals," Proceedings of the National Academy of Sciences of the United States of America, vol. 102, Issue:30, pp. 10451-10453, Jul. 26, 2005.
Novoselov, K.S., et al., "Two-Dimensional Gas of Massless Dirac Fermions in Graphene," Nature (2005), vol. 438, Issue 7065, 6 pages.
Ritter, K.A., and Lyding, J.W., "Characterization of nanometer-sized, mechanically exfoliated graphene on the H-passivated Si(100) surface using scanning tunneling microscopy," Nanotechnology, vol. 19, Issue: 1, Nov. 1, 2007, 13 pages.
Schniepp, H.C., et al., "Functionalized Single Graphene Sheets Derived from Splitting Graphite Oxide," Journal of Physical Chemistry B (2006), vol. 110, Issue:17, pp. 8535-8539.
Si, Y., and Samulski, E.T., "Synthesis of water soluble graphene," Nano Letters (2008), vol. 8, Issue:6, pp. 1679-1682.
Stankovich, S., et al., "Graphene-based composite materials," Nature 442, pp. 282-286, Jul. 20, 2006.
Wallace, P.R., "The band theory of graphite," Phys. Rev. 71, pp. 622-634 (1947).
Wilhelm, H.A., et al., "Proportion and dispersion of rhombohedral sequences in the hexagonal structure of graphite powders," Carbon (2007), vol. 45, Issue:12, pp. 2356-2364.
Zhang, C., et al., "Surface enhanced Raman scattering of biospecies on anodized aluminum oxide films," Chemical Physics Letter, (2007), vol. 440, Issue:4-6, pp. 239-243.
Zhang, C., et al., "Surface enhanced Raman with anodized aluminum oxide films," Journal of Chemical Physics, (2007), vol. 127, Issue:4, pp. 044701-1 to 044701-5.
Zhang, Y., et al., "Electric Field Modulation of Galvanomagnetic Properties of Mesoscopic Graphite," Phys.Rev.Lett., (2004), 94 ,176803, 4 pages.
Zhang, Y., et al., "Experimental Observation of the Quantum Hall Effect and Berry's Phase in Graphene," Nature (2005), vol. 438, Issue:7065, 5 pages.

* cited by examiner

A

B

C

D

E

GRAPHENE DEPOSITION AND GRAPHENATED SUBSTRATES

CROSS REFERENCE TO RELATED APPLICATIONS

This is a divisional under 35 U.S.C. §121 of and claims priority under 35 U.S.C. 120 to U.S. patent application Ser. No. 12/626,077, entitled "GRAPHENE DEPOSITION AND GRAPHENATED SUBSTRATES", filed Nov. 25, 2009, which is a non-provisional of and claims priority under 35 U.S.C. §119(e) to U.S. Provisional Application 61/118,124, entitled "SYSTEM AND METHOD FOR PROCESSING GRAPHENE," filed Nov. 26, 2008; which are incorporated by reference.

STATEMENT OF GOVERNMENT SUPPORT

The invention was made with Government support under contract NSF IIS0514361. The Government has certain rights in the invention.

BACKGROUND

Unless otherwise indicated herein, the materials described in this section are not prior art to the claims in this application and are not admitted to be prior art by inclusion in this section.

Graphite is a known crystallographic form of carbon. A monolayer honeycomb structure of carbon atoms, known as graphene, has been considered thermodynamically unstable in free-standing form. Research efforts have studied graphene's electronic characteristics. Graphene appears to possess properties that may be advantageous in certain applications, for example, graphene appears to be chemically inert and appears to exhibit no absorption in the mid-infrared (IR) spectral range.

Graphene formation techniques include, for example, cleavage of Highly Oriented Pyrolytic Graphite (HOPG) followed by transfer of a few layers to a substrate, peeling off surface layers of HOPG using tape, and transferring the surface layers to a substrate by subsequent taping. Another graphene formation technique includes an exfoliation and Dry Contact Transfer (DCT) technique, which relies on transferring small crystallites from a stamp or a mold to a solid substrate. Graphene formation techniques have not been compatible with practical, large-scale production.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 6 depicts Scanning Electron Microscope (SEM) images relating to graphenated substrates that may be formed using Si substrates, and in which: FIG. 6A shows a graphite layer on a Si substrate; FIG. 6B shows a graphene film on a Si substrate after annealing and polishing; FIG. 6C is a closer view of a graphene film on a Si substrate after annealing and polishing of FIG. 6B; and FIG. 6D shows 2-3 layered graphene film between two pre-fabricated electrodes on a Si substrate;

FIG. 7 depicts SEM images relating to graphenated substrates that may be formed using Anodized Aluminum Oxide (AAO) substrates, and in which: FIG. 7A and FIG. 7B show the AAO substrate itself; FIG. 7C shows an AAO substrate after deposition of a graphite material; FIG. 7D shows an AAO substrate with a multi-layered graphite layer; and FIG. 7E shows an AAO substrate with a multi-layered graphite layer after a thinning stage, which depicts a monolayer of graphene film;

DETAILED DESCRIPTION

Figures 1, 2:
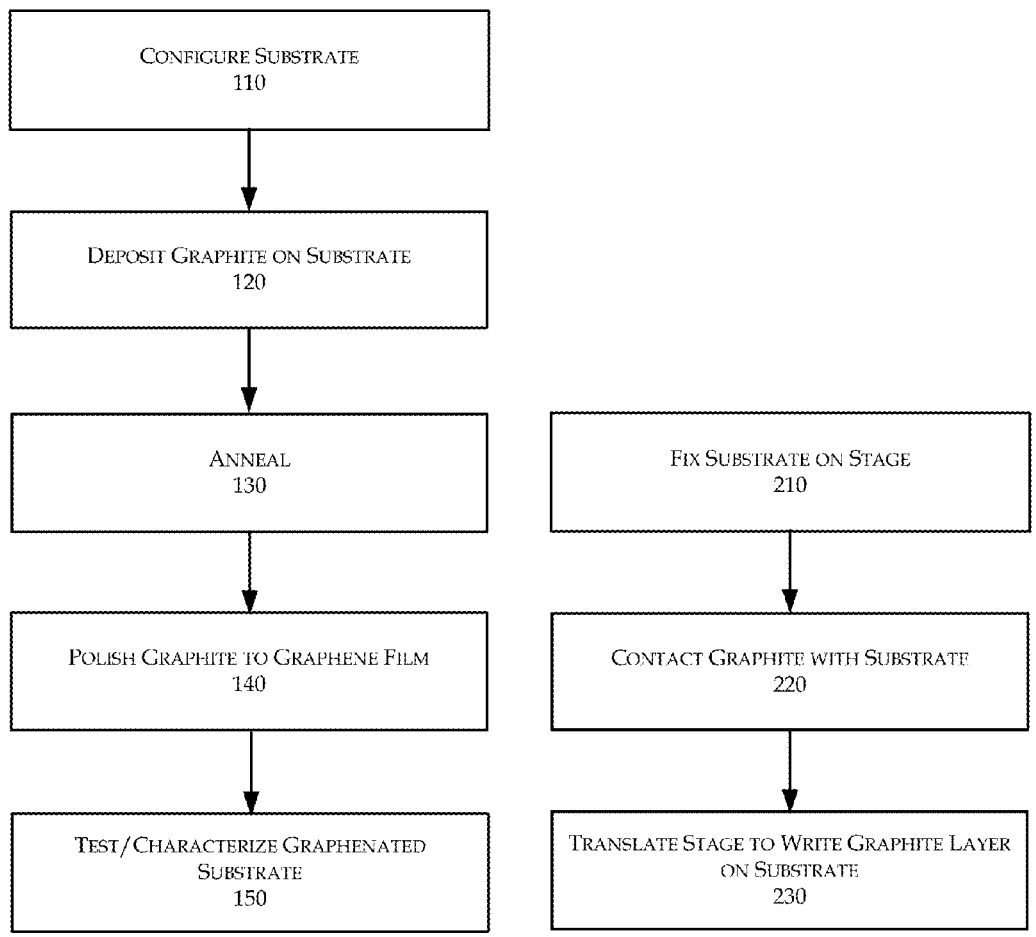
FIG. 1 is a flow diagram of a representative method to form a graphene film on a substrate.
FIG. 2 is a flow diagram of a representative method to deposit graphite on a substrate.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and made part of this disclosure.

The present disclosure is generally drawn, inter alia, to methods, devices, systems and/or articles related to techniques for forming a graphene film on a substrate, and the resulting graphene layers and graphenated substrates. Some example techniques may be embodied as methods or processes for forming graphene. Some other example techniques may be embodied as devices employed to manipulate, treat, or otherwise process substrates, graphite, graphene and/or graphenated substrates as described herein. Graphene layers and graphenated substrates produced by the various techniques and devices provided herein are also disclosed.

FIG. 1 is a flow diagram of a representative method to form a graphene film on a substrate in accordance with at least some embodiments of the present disclosure. The example method can include various operations, functions, and/or actions as illustrated by one or more of blocks 110, 120, 130, 140 and/or 150.

In general, with reference to FIG. 1, example methods disclosed herein may comprise: configuring a substrate; depositing a graphite layer on the substrate; annealing the graphite layer to provide a reoriented graphite layer on the substrate; polishing the reoriented graphite layer to provide a graphene film on the substrate (i.e., a graphenated substrate); and/or testing and characterizing the resulting graphenated substrate. The blocks illustrated in FIG. 1 may be grouped into three stages: a graphite deposition stage may comprise blocks 110 and 120; a thinning stage may comprise blocks 130 and 140; and a testing phase may comprise block 150. Aspects of FIG. 1 may be characterized, in some embodiments, as a modified Chemical Mechanical Polishing (CMP) technique.

Figure 14:
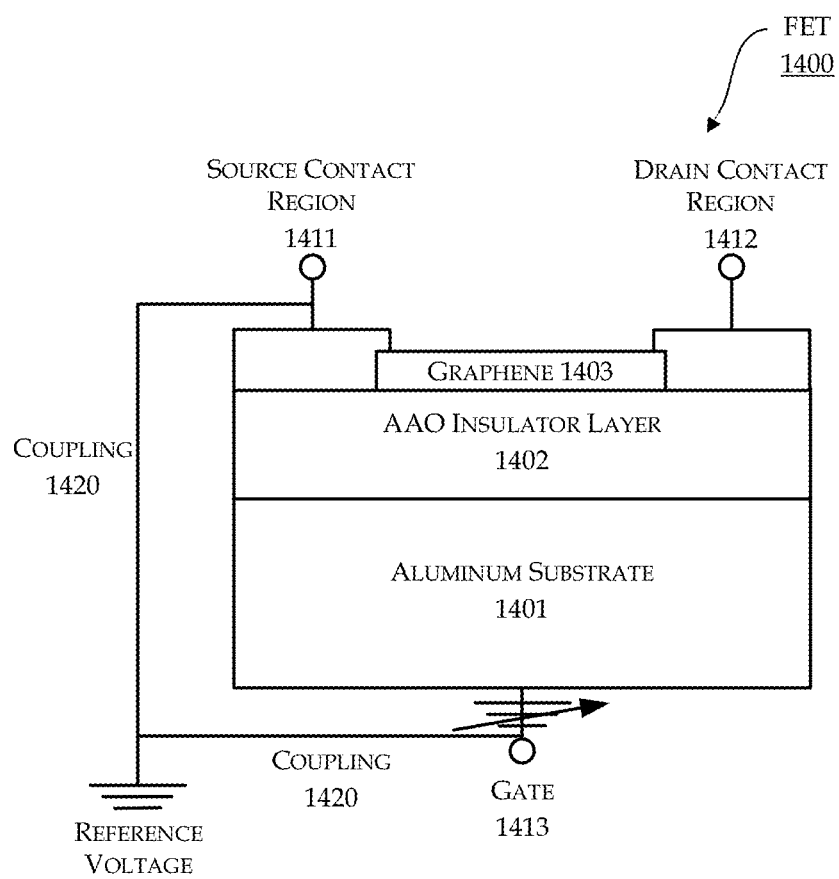
FIG. 14 is a schematic diagram of an example Field Effect Transistor (FET) comprising a graphenated substrate; all arranged in accordance with at least some embodiments of the present disclosure.

Referring to FIG. 1 in detail, block 110, "Configure Substrate", may comprise configuring substrate for graphite deposition and formation of one or more graphene layers on a surface of the substrate. Substrate properties that may be configured include substrate material, coating, surface features, size, shape, and arrangement of electrodes or other items in or on a substrate. A variety of substrate properties are disclosed herein in connection with various disclosed embodiments and substrates comprising any such substrate properties may be configured in block 110. For example, a substrate may be oxidized to create an oxidation layer. Also, electrodes and/or contact regions may be configured in or on a substrate. In some embodiments, contact regions may be configured on a substrate to prepare the substrate to serve as a Field Effect Transistor (FET) as illustrated in FIG. 14. Block 110 may be followed by block 120.

Figure 3:
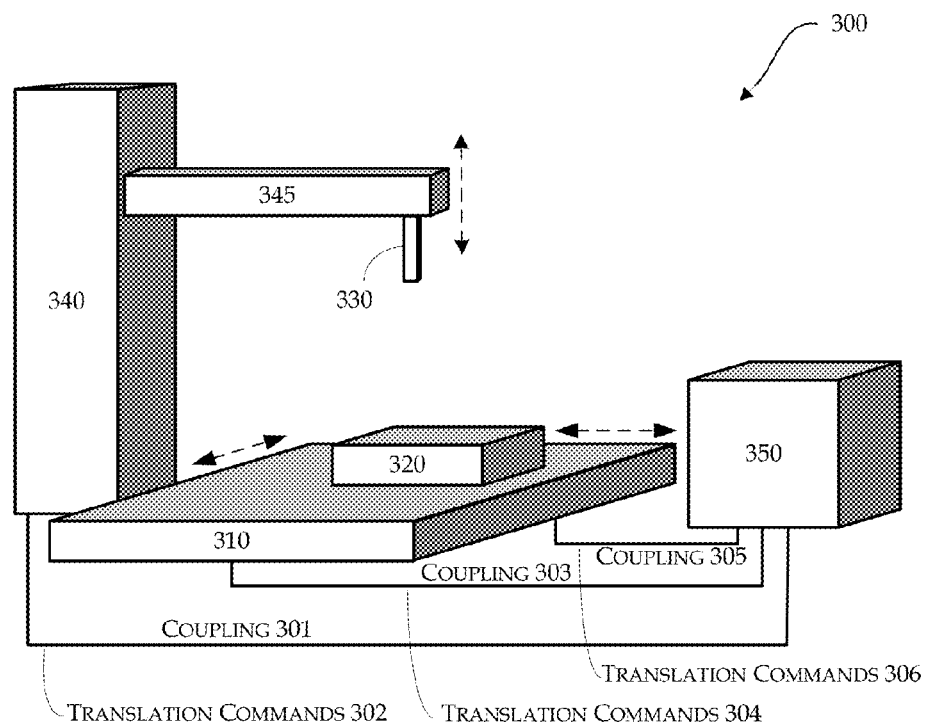
FIG. 3 is a schematic illustration of a representative writing system.

In block 120, "Deposit Graphite on Substrate", graphite may be deposited on a configured substrate. Example methods of depositing graphite are disclosed in connection with FIG. 2 and FIG. 3 and corresponding description. FIG. 2 and FIG. 3 are generally directed to writing graphite on a substrate using a system comprising a translational stage. It should be emphasized that other techniques for depositing graphite may be applied in some embodiments. For example, any known or future developed graphite deposition techniques may be applied, including but not limited to the tape transfer and exfoliation followed by DCT mechanical deposition techniques discussed in the background section. Additionally, a formulated graphite powder or graphite spray may be applied to a treated substrate in some embodiments. A substrate might also be submerged in a bath comprising a graphite solution in some embodiments. Such approaches may or may not be applicable in some embodiments, however they are referenced here to emphasize that a range of graphite deposition techniques may be utilized in connection with some embodiments. Block 120 may be followed by block 130.

In block 130, "Anneal", a substrate having a graphite layer on one or more surfaces may be annealed to provide a substrate having a reoriented graphite layer on the surface(s). A graphite layer exfoliated onto the surface of a substrate may be irregular and comprised of small, approximately micron sized, crystalline domains. Not wanting to be limited by theory, it is believed that the domains and related stacking faults in the exfoliated graphite layer may be recovered upon high-temperature annealing due to the relatively low energy needed for re-orientation of domains in stacked hexagonal layers. Therefore, substrates having a graphite layer may be subjected to a thinning stage to obtain a substrate having a graphene film on a surface.

In some embodiments, an annealing process may be carried out in an oven. The inside of the oven may be large enough to place substrate(s) having a graphite layer on a surface in a position to receive maximum exposure to circulating heated air in the oven. For example, gas fired conveyor furnaces may be used to accommodate a large number of substrates. For large substrates, car-bottom furnaces may also be used to allow easily moving substrates in and out of the oven. Some examples ovens may be configured to dynamically adapt their temperature according to a temperature profile (e.g., a process recipe) where the temperature may gradually increase to an annealing temperature, maintain at the annealing temperature, and then gradually decrease. Some example conveyor type ovens may also utilize a temperature profile that includes multiple temperature zones and a corresponding conveyor belt speed that are arranged to ramp the temperature up and down according to a desired temperature profile. The various temperatures and/or conveyor belt speeds may be adapted in response to instructions from controller 350.

In some embodiments, annealing may be carried out at a selected annealing temperature, for a selected annealing time, and in a selected annealing environment. A variety of annealing temperatures, times, and environments are disclosed herein, any of which may be applicable in some embodiments. In general annealing temperatures may range from about 300° C. to about 900° C. In some examples, annealing times may range from about one hour to several hours. Selected annealing environments for the annealing process may comprise, for example, an oxidized atmosphere, or an atmosphere comprising argon (Ar) and/or one or more other gasses. Block 130 may be followed by block 140.

In block 140, "Polish Graphite to Graphene Film", a graphite layer may be polished to provide a substrate having a graphene film on a surface of the substrate. In some embodiments, polishing may be utilized to remove loose particulates and/or to planarize the surface such that the substrate has a graphene film with a desired surface profile.

In some embodiments, polishing may include sonication of a substrate in an organic solution. Sonication may be carried out using an ultrasonic bath or an ultrasonic probe, colloquially known as a sonicator. The organic solution may be an aqueous or non-aqueous solution. Substrate properties may be assessed to determine whether an aqueous or non-aqueous solution is preferable. In some embodiments, the organic solution may comprise an ethanol solution.

In some embodiments, polishing may include chemical and/or mechanical polishing to thin and planarize a graphite deposit and/or one or more layers of graphene. Chemical polishing may comprise applying one or more chemical treatments to a surface. Mechanical polishing may comprise contacting a surface with a mechanical polishing agent, applying a desired polishing force, and moving the polishing agent across the surface for a desired polishing effect. In some embodiments, chemical and/or mechanical polishing may be applied to produce uniform properties in one or more layers of graphene, such as uniform electrical properties and/or physical properties. In some embodiments, polishing may be performed as an intermediate step so that additional layers of graphene or other materials can be placed on top of a graphenated surface without the surface becoming non-uniform.

In some alternatives, a substrate having an exfoliated graphite layer on the surface may be polished without annealing to provide a substrate having a graphene film on the surface. Block 140 may be followed by block 150.

In block 150, "Test/Characterize Graphenated Substrate", a graphenated substrate may be tested and/or characterized using any of the various techniques disclosed herein. The term "graphenated substrate" may be used herein to refer to a substrate with one or more layers of graphene disposed on a surface thereof. In some embodiments, a graphene film resulting from application of the techniques described herein may be tested and characterized using a SEM, a Raman spectrometer, a Fourier Transform Infrared (FTIR) spectrometer, and/or current and voltage measurements across electrodes with graphene films formed between the electrodes. An example Raman spectrometer may include, for example, a 75 centimeter (cm) single-chamber spectrometer equipped with a cooled Charge-Coupled Device (CCD) camera at about negative 15 degrees (−15°) Celsius (C), pumped with a 514.5 nanometer (nm) line Ar laser at about 20 milliwatts (mW).

In some embodiments, the graphite deposited on substrates as described herein may comprise HOPG, which can be deposited on a surface in a desired pattern, to provide a graphite layer having the desired pattern and corresponding graphene film in the desired pattern.

In some embodiments, graphenated substrates produced according to processes disclosed herein may serve as a platforms or as electrodes in optical and/or electronic devices. For example, optical properties of graphenated substrates disclosed herein in may find application in opto-transistors, and the electrical properties of graphenated substrates disclosed herein in may find application Field Effect Transistors (FETs) such as FIG. 14. Graphenated substrates may also find use in a range of other applications of both current and potential technologies. For example, the use of graphene and graphenated substrates in well-organized surface plasmon 'hot-spots', which drive local chemical reactions, may be a promising potential application.

In some embodiments, graphene deposited according to processes disclosed herein may be deposited on relatively large areas, e.g., areas formed of a contiguous layer of graphene may be in the range of about 200 μm×50 μm or about 10,000 square microns ($\mu m^2$) and beyond. Graphene may be deposited on a large variety of substrates including, for example, metallic as well as oxide substrates, and using techniques accepted by the Very Large-Scale Integration (VLSI) circuit industry. Ease of use, large area of deposit, and adaptability to VLSI may be advantages of certain embodiments of the technologies disclosed herein.

FIG. 2 is a flow diagram of a representative method to deposit graphite on a substrate in accordance with at least some embodiments of the present disclosure. The example method can include various operations, functions, or actions as illustrated by one or more of blocks 210, 220, and/or 230.

In general, with reference to FIG. 2, example methods disclosed herein may comprise writing graphite on a substrate using a system such as illustrated in FIG. 3, and identifiers from FIG. 3 are used in the following discussion of FIG. 2. Block 210, "Fix Substrate on Stage", may comprise attaching a substrate 320 to a two dimensional (2D) translational stage 310 such that graphite 330 may be deposited in controlled locations on the substrate 320.

In some embodiments, fixing a substrate 320 on a stage 310 may comprise placing the substrate 320 in a desired location on the stage 310. Depending on the coefficients of friction of the substrate 320 and the stage 310 and the contact area of the substrate 320 with the stage 310, placement of the substrate 320 on the stage 310 may or may not be sufficient to fix the substrate 320 on the stage 310. Where the friction forces between substrate 320 and stage 310 are insufficient to fix the substrate 320 in place, methods such as applying a vacuum suction under the substrate 320 (e.g., the stage 310 may includes one or more vacuum holes positioned under the substrate 320 and adapted to "pull" the substrate 320 down on the surface of the stage 310 with a vacuum pump device that may be coupled to the stage 310 via a fitting such as flexible hose), bracing sides of a substrate 320, clamping the substrate 320 in position (e.g., with a lateral clamp and/or a vertical clamping mechanism that applies pressure to either the side or top of the substrate 320) using an adhesive material (e.g., a bonding agent such as a glue or other sticky material) between the substrate 320 and stage 310, applying magnetic forces to a substrate using for example one or more electromagnets, and applying rivets, screws or some other method of affixing the substrate 320 in a desired position on the stage 310.

It will be appreciated that methods for fixing a substrate 320 on a stage 310 may vary depending upon the substrate 320 material, stage material, and configurations of the substrate 320 and stage 310. For example, techniques for fixing a mesh substrate 320 on a stage 310 may comprise apparatus for flattening and stretching the mesh over the stage 310. Techniques for fixing a solid platform substrate 320 on a stage 310 may comprise bracing sides of the substrate 320 to hold the substrate 320 in place. In some embodiments, fixing the substrate 320 on the stage 310 may comprise removably fixing the substrate 320 on the stage 310, wherein removably fixing includes fixing in a manner that is impermanent and/or designed for later substrate 320 removal. Block 210 may be followed by block 220.

In block 220, "Contact Graphite with Substrate", graphite 330 may be brought into contact with the surface of the substrate 320. Graphite 330 may be brought into contact with the surface of the substrate 320 for example using an apparatus comprising a second stage 340 as illustrated in FIG. 3. In some embodiments, a second stage 340 may implement vertical movement of graphite 330 to bring the graphite 330 to a height of a substrate surface and to implement a desired contact force. The stage 310 may bring the substrate 320 to a selected location for contact between the graphite 330 and the substrate 320 at a desired contact location.

In some embodiments, contacting graphite 330 with the substrate 320 may be carried out at least in part by a controller 350 as illustrated in FIG. 3. In some examples, the controller 350 may be adapted to interactively receive graphite deposition data via a user interaction with a user interface implemented at the controller 350. In some other examples, the controller 350 may be adapted to automatically generate graphite deposition data without user interaction, such as via data (e.g., a portion of a recipe) that may be retrieved, programmed and/or generated by controller 350. The controller 350 may be configured to select initial contact coordinates from among graphite deposition locations identified in received graphite deposition data. The controller 350 may be configured to generate translation commands 302 and/or 304 and 306 for the second stage 340 and/or translational stage 310, and may be configured to send translation commands to the second stage 340 and translational stage 310 via wired or wireless couplings 301, 303 and/or 305.

The translation commands 302 and/or 304 and 306 may comprise or otherwise implement the initial contact coordinates. In some examples, the initial contact coordinates may comprise x, y, and/or z coordinates for an initial graphite and substrate contact location, as well as a contact force. The x and y coordinates may designate a location of a substrate 320 or portion thereof on the horizontal plane of the translational stage 310, and the z coordinates may specify a height of a substrate 320 surface above the plane of the translational stage 310. In other examples, the initial contact coordinates may be of another type of coordinate system such as vector coordinates or some other coordinate system. The controller 350 may be configured to cause the second stage 340 and/or translational stage 310 to move the graphite 330 into contact with the substrate 320 at the initial contact coordinates via translation commands 302 and/or 304 and 306.

In some embodiments, contacting graphite 330 with the substrate 320 may be performed using a selected contact force. The contact force may vary with substrate material, substrate dimensions, substrate surface properties, and/or graphite properties. For example, where a substrate 320 and/or graphite 330 made of a soft, fragile, or thin material, a selected contact force may be reduced to avoid damaging the substrate 320 and/or graphite 330. Conversely, where a substrate 320 and/or graphite 330 is made of a hard, durable, or thick material, a selected contact force may be increased because damaging the substrate 320 and/or graphite 330 may be less likely. In some embodiments, graphite deposition data received at controller 350 may specify a contact force.

In some embodiments, a contact force may be selected based on desired graphite application density and/or application speed. A large contact force may result in thicker graphite application density and may also result in faster graphite application speeds. In some embodiments, a selected contact force may be increased for thicker graphite application density and/or faster graphite application speed, and conversely a selected contact force may be decreased for thinner graphite application density and/or slower graphite application speed. Also, the second stage 340 may adaptively adjust graphite 330 location using a spring or other apparatus to maintain a constant selected contact force during graphite deposition in some embodiments. Block 220 may be followed by block 230.

In block 230, "Translate Stage to Write Graphite Layer on Substrate", a translational stage 310 in an apparatus such as illustrated in FIG. 3 may be translated to "write" a graphite layer on a surface of the substrate 320. In some embodiments the translational stage 310 may comprise a 2D translational stage 310 that may be translated along the x and y axes of the 2D plane occupied by the stage 310. Stage 310 translation may be carried out at least in part by a controller 350 as illustrated in FIG. 3. The controller 350 may dynamically receive graphite deposition data (either interactively via a user interaction with a user interface or via an automated process that retrieves data from a file, programmed recipe, or other data structure and provides data to the controller 350). The controller 350 may be configured to translate the graphite deposition data into translation commands 304 and/or 306 for the translational stage 310, and may send translation commands 304 and/or 306 to the translational stage 310 via wired or wireless couplings 303 and 305. The translation commands 304 and/or 306 may for example comprise or otherwise implement x and y coordinate translations (or any other coordinate based translations which may use coordinate systems other than Cartesian coordinates) for translating substrate location to deposit graphite 330 in specified graphite deposition locations and/or deposition patterns on a substrate 320.

Any of a variety of mechanisms and configurations may be used to implement translation of the translational stage 310. For example, in some embodiments, the translational stage 310 may be moveably coupled to a base platform, and electronic servo-type motors may be activated by controller 350 to move the translational stage 310 along either or both axes of a 2D plane. It will be appreciated that other configurations are possible. In some embodiments, graphite deposition on more than one surface of a substrate may be achievable using appropriately configured apparatus, controller and translation commands.

FIG. 3 is a schematic illustration of a representative writing system configured to carry out at least some embodiments of the present disclosure. Example writing system 300 may comprise a translational stage 310, a substrate 320, a controller 350, and a second stage 340. The second stage may be fitted with a writing arm 345 and graphite 330.

In FIG. 3, the substrate 320 may be situated on the translational stage 310. The second stage 340 may be situated proximal to the translational stage 310 with the writing arm 345 and graphite 330 disposed over the translational stage 310. Controller 350 may be coupled to translational stage 310 via one or more wired or wireless couplings 303, 305, and may be arranged to communicate translation commands 304, 306 to the translational stage 310. Controller 350 may be coupled to second stage 340 via one or more wired or wireless couplings 301, and may be arranged to communicate translation commands 302 to the second stage 340.

The example writing system 300 may include a 2D translational stage 310 on which a substrate 320 can be fixed. The 2D translational stage can configured for dynamic translation (e.g., via a controller 350 or some other programmed control such as a computing device or processor) to create a graphite layer in a desired pattern on a surface of the substrate 320. The deposited graphite layer may cover an entire substrate surface or selected portions of the surface, and may be deposited according to desired pattern such as a series of parallel lines patter, a checkerboard pattern, or any number of other patterns. The desired pattern can be provided by either user based input, or under automated control such as by the controller 350 accessing or retrieving a previously programmed pattern.

Operations of the writing system 300 are described above with reference to FIG. 2. In general, writing system 300 may be configured to receive a substrate 320 on the 2D translational stage 310, for example using one or more of the structures for fixing a substrate 320 to a stage 310 discussed above. Writing system 300 may be further configured to receive graphite 330 in a writing arm 345. Controller 350 may be configured receive graphite deposition data for graphite deposition operations via a mechanism such as a user interface, a data connection, or a memory accessed by controller 350. Controller 350 may be configured to produce translation commands 302, 304, and/or 306 and to communicate the translation commands to the second stage 340 and translational stage 310 via wired or wireless couplings 301, 303, and/or 305. Controller 350 may be configured to produce translation commands 302, 304, and/or 306 to bring the graphite 330 into contact with the substrate 320 at selected initial contact coordinates and/or at a selected contact force. Controller 350 may also be configured to produce subsequent translation commands 302, 304, and/or 306 to program or initiate movement of the translational stage 310 along a desired path such that graphite can be deposited on the substrate 320 according to a desired pattern as indicated by the received graphite deposition data, while also maintaining contact between the graphite 330 and the substrate 320 at a selected contact force.

Figure 4:
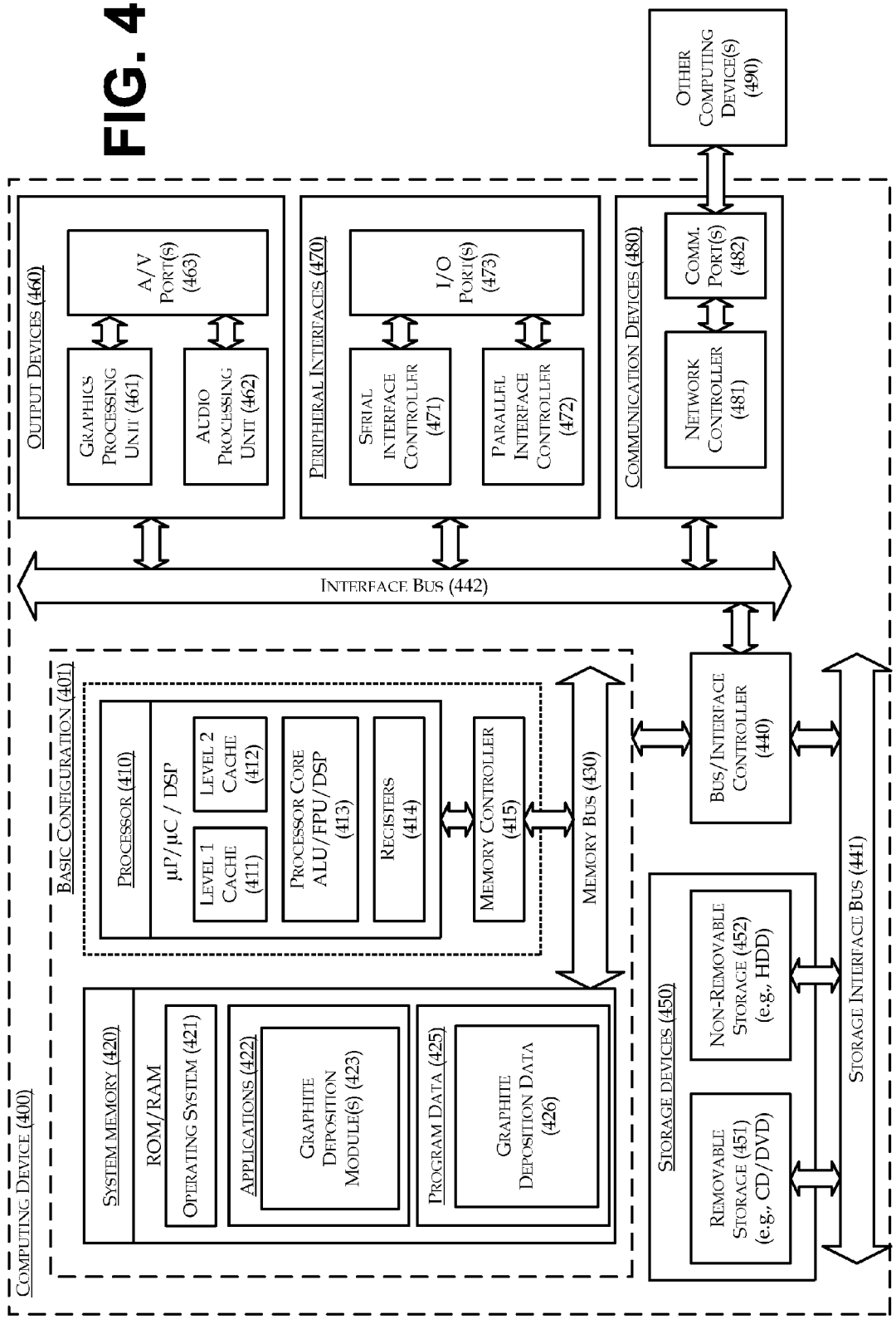
FIG. 4 is a block diagram of an example computing device.

Controller 350 may comprise a controller device such as a computing device 400 as illustrated in FIG. 4, or some other equivalent controller device such as a processor, a microcontroller, an Application Specific Integrated Circuit (ASIC), or some other circuit or system similarly configured. In some alternative examples, the 2D translational stage 310 and/or the second stage 340 may be controlled by two different processors (or equivalent controller devices).

FIG. 4 is a block diagram of an example computing device 400 configured to perform various operations in accordance with at least some embodiments of the present disclosure. In some examples, computing device 400 may be adapted to perform the operations, functions or actions of controller 350. In a very basic configuration 401, computing device 400 may include one or more processors 410 and system memory 420. A memory bus 430 may be used for communicating between the processor 410 and the system memory 420.

Depending on the desired configuration, processor 410 may be of any type including but not limited to a microprocessor (μP), a microcontroller (μC), a digital signal processor (DSP), or any combination thereof. Processor 410 may include one or more levels of caching, such as a level one cache 411 and a level two cache 412, a processor core 413, and registers 414. The processor core 413 may include an arithmetic logic unit (ALU), a floating point unit (FPU), a digital signal processing core (DSP Core), or any combination thereof. A memory controller 415 may also be used with the processor 410, or in some implementations the memory controller 415 may be an internal part of the processor 410.

Depending on the desired configuration, the system memory 420 may be of any type including but not limited to volatile memory (such as RAM), non-volatile memory (such as ROM, flash memory, etc.), or any combination thereof. System memory 420 typically includes an operating system 421, one or more applications 422, and program data 425. Applications 422 may include, for example, graphite deposition module(s) 423. Program data 425 may include graphite deposition data 426 that may be used by graphite deposition module(s) 423. Applications 422 may be arranged to utilize graphite deposition data 426 to operate in accordance with one or more of the methods, processes, systems, and/or devices described herein.

Computing device 400 may have additional features or functionality, and additional interfaces to facilitate communications between the basic configuration 401 and any required devices and interfaces. For example, a bus/interface controller 440 may be used to facilitate communications between the basic configuration 401 and one or more data storage devices 450 via a storage interface bus 441. The data storage devices 450 may be removable storage devices 451, non-removable storage devices 452, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives, to name a few. Example computer storage media may include volatile and nonvolatile, removable and non-removable media implemented in any method or technology for storage of information, such as computer readable instructions, data structures, program modules, or other data.

System memory 420, removable storage 451, and non-removable storage 452 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium that may be used to store the desired information and that may be accessed by computing device 400. Any such computer storage media may be part of device 400.

Computing device 400 may also include an interface bus 442 for facilitating communication from various interface devices (e.g., output interfaces, peripheral interfaces, and communication interfaces) to the basic configuration 401 via the bus/interface controller 440. Example output devices 460 include a graphics processing unit 461 and an audio processing unit 462, which may be configured to communicate to various external devices such as a display or speakers via one or more A/V ports 463. Example peripheral interfaces 470 may include a serial interface controller 471 or a parallel interface controller 472, which may be configured to communicate through either wired or wireless connections with external devices such as input devices (e.g., keyboard, mouse, pen, voice input device, touch input device, etc.) or other peripheral devices (e.g., printer, scanner, etc.) via one or more I/O ports 473. Other conventional I/O devices may be connected as well such as a mouse, keyboard, and so forth. An example communications device 480 includes a network controller 481, which may be arranged to facilitate communications with one or more other computing devices 490 over a network communication via one or more communication ports 482.

The computer storage media may be one example of a communication media. Communication media may typically be embodied by computer readable instructions, data structures, program modules, or other data in a modulated data signal, such as a carrier wave or other transport mechanism, and include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR), and other wireless media.

Computing device 400 may be implemented as a portion of a small-form factor portable (or mobile) electronic device such as a cell phone, a personal data assistant (PDA), a personal media player device, a wireless web-watch device, a personal headset device, an application-specific device, or a hybrid device that include any of the above functions. Computing device 400 may also be implemented as a personal computer including both laptop computer and non-laptop computer configurations.

Figure 5:
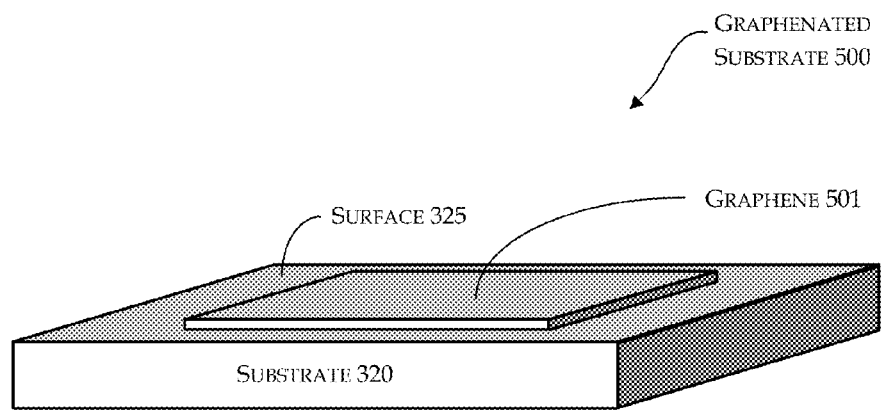
FIG. 5 illustrates an example graphenated substrate.

FIG. 5 illustrates an example graphenated substrate 500, in accordance with at least some embodiments of the present disclosure. The graphenated substrate 500 may comprise a substrate 320 and graphene 501 disposed on a surface 325 of the substrate 320.

The material of the substrate 320 may vary as needed for particular applications. Representative materials for the substrate 320 may include silicon (Si), AAO, and/or copper (Cu), although any of a wide variety of other materials and/or composite materials may be used in some embodiments.

Surface 325 may have various features, for example the surface 325 or portions thereof may comprise a solid and non-perforated platform, a platform perforated with small holes, and/or a largely perforated platform. Surface 325 may also comprise any size and shape, and is not limited to the illustrated substantially square shape.

In some embodiments, graphene 501 may comprise a graphene layer or graphene film. Graphene 501 may comprise a monolayer honeycomb structure of carbon atoms. Graphene 501 may be deposited in one or several layers, e.g., as one or more monolayer honeycomb structures of carbon atoms. A variety of example properties of graphenated substrates are discussed further in connection with FIG. 6-FIG. 13.

Figure 6:
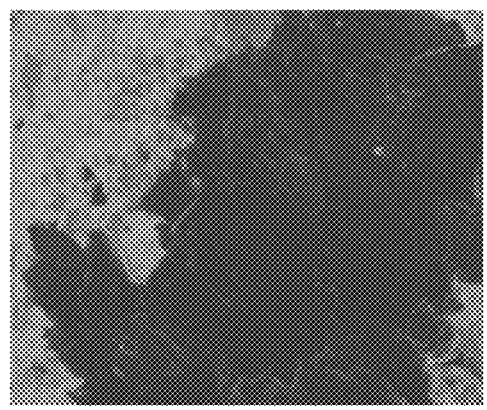
Figure 6:
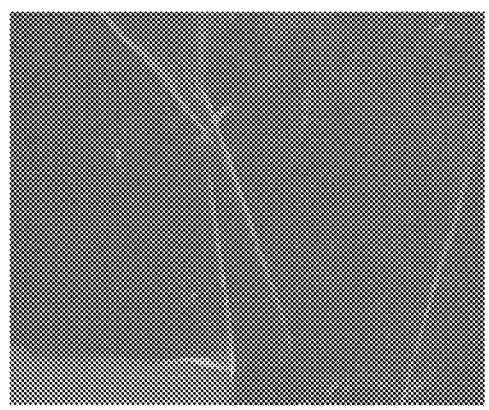
Figure 6:
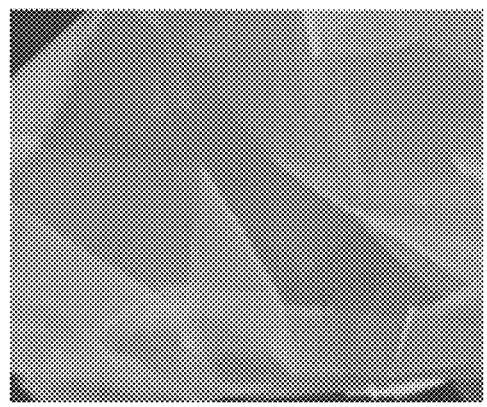
Figure 6:
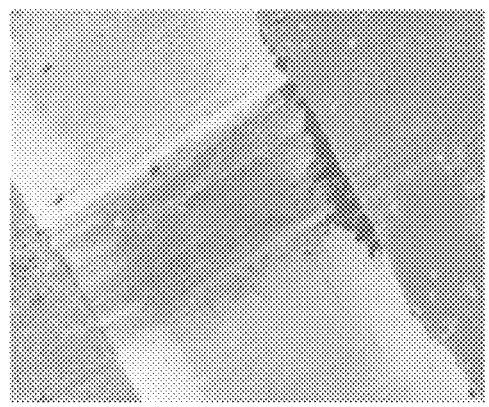

FIG. 6 depicts Scanning Electron Microscope (SEM) images relating to graphenated substrates that may be formed using Si substrates, in accordance with at least some embodiments of the present disclosure, and in which: FIG. 6A shows a graphite layer on a Si substrate; FIG. 6B shows a graphene film on a Si substrate after annealing and polishing; FIG. 6C is a closer view of a graphene film on a Si substrate after annealing and polishing of FIG. 6B; and FIG. 6D shows 2-3 layered graphene film between two pre-fabricated electrodes on a Si substrate.

In some embodiments, graphenated substrates according to FIG. 6 may be produced using substrates comprising p-type Si wafers with a selected wafer doping, for example, a doping of about $10^{-16}$ cm$^{-3}$. Si wafers may be oxidized by forming an oxide layer on a surface of the Si wafer. An oxide layer may be a selected thickness, e.g., a layer in the range of about 30 nm thick may be used in producing graphenated substrates illustrated in FIGS. 6B and 6C. An oxide layer may be produced for example by annealing in an oxygen-rich atmosphere. Graphite may be brought into contact with an oxidized Si wafer surface to provide a graphite layer as illustrated in FIG. 6A.

A Si wafer having the graphite layer may then be annealed. This disclosure is not limited to any particular temperature range, annealing time, or annealing environment. The graphenated substrates illustrated in FIGS. 6B and 6C may be produced for example by annealing at a temperature in a range of about 800° C. to about 900° C. for about 3 hours in an annealing environment characterized by about 100 Standard Cubic Centimeters per Minute (sccm) of Ar.

Sonication may also be applied. For example, in some embodiments annealing may be followed by up to about one minute of sonication in ethanol to "thin" the graphite layer into a graphene film on the wafer surface.

In some embodiments, graphenated substrates illustrated in FIGS. 6B and 6C may be characterized by areas of coverage of about 200 μm×50 μm or 10,000 μm² for least some of the graphite deposition lines applied according to a writing method such as illustrated in FIG. 1. Subsequent and adjacent graphite deposition lines may also be produced on a graphenated substrate, allowing for larger effective coverage areas.

FIG. 6D shows an example graphenated substrate comprising a plurality of graphene layers, as well as a graphenated substrate structure resulting from a substrate on which electrodes may be arranged as described in connection with FIG. 2. FIG. 6D illustrates a 2-3 layered graphene film forming a bridge between two pre-fabricated electrodes on a substrate. Graphenated substrates according to FIG. 6D may comprise a Si substrate with a layer of Silicon Oxide (SiO$_2$) about 10 nanometers (nm) thick, a layer of Titanium (Ti) about 30 nm thick, and a layer of Cobalt (Co) about 30 nm thick. Other metals such as Palladium (Pd) and Chromium (Cr) may also be used as will be appreciated with the benefit of this disclosure. A bridge of a desired length may be formed using a selected distance between electrodes. For example, the bridge illustrated in FIG. 6D may be approximately 60 μm in length.

Figure 7:
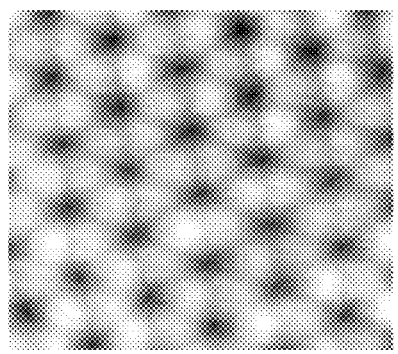
Figure 7:
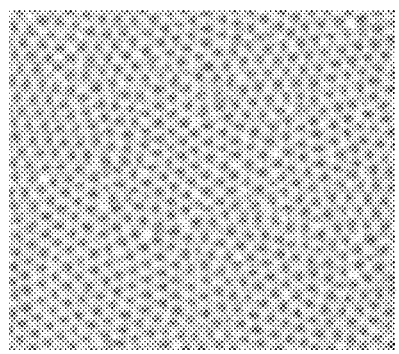
Figure 7:
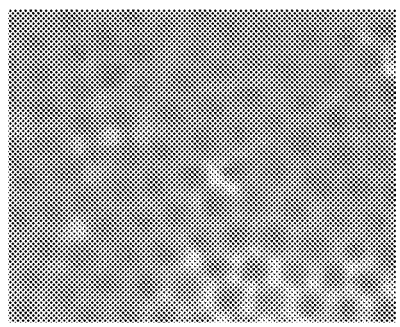
Figure 7:
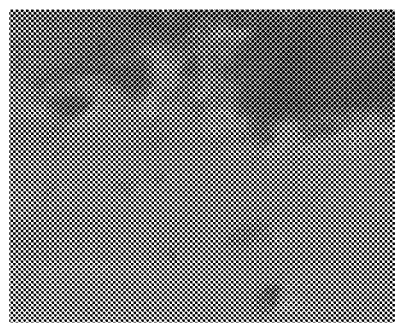
Figure 7:
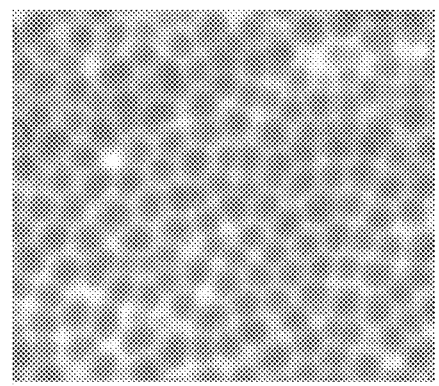

FIG. 7 depicts SEM images relating to graphenated substrates that may be formed using AAO substrates, in accordance with at least some embodiments of the present disclosure, and in which: FIG. 7A and FIG. 7B show the AAO substrate itself; FIG. 7C shows an AAO substrate after deposition of a graphite material; FIG. 7D shows an AAO substrate with a multi-layered graphite layer; and FIG. 7E shows an AAO substrate with a multi-layered graphite layer after a thinning stage, which depicts a monolayer of graphene film.

Graphenated substrates such as illustrated in FIG. 7E may be produced using a periodically perforated AAO surface. For example, FIGS. 7A and 7B show an AAO substrate surface at different magnification levels. A perforated oxide layer may be formed on top of an aluminum substrate. The layer may be of a selected thickness, for example, some embodiments may form an oxide layer about 50 nm thick. The oxide layer may contain a perforation array of a selected array pattern. For example, some embodiments may employ a hexagonal perforation array pattern in which the diameter of each perforation may be approximately 20 nm and the array pitch may be about 90 nm.

In some embodiments, deposition and processing of graphene on an AAO substrate may be similar to techniques describe above in connection with the Si substrates.

FIG. 7C shows an AAO substrate after deposition of a graphite material. At this stage, a perforation array as described above may be observable through the graphite layer, as illustrated in FIG. 7C. A plurality of layers of graphite may be deposited on the substrate. FIG. 7D shows an AAO substrate with a multi-layered graphite layer.

Due to the presence of aluminum in AAO substrates, lower annealing temperatures may be selected in some embodiments. For example, annealing temperatures in a range of about 400° C. to about 500° C. may be selected in some embodiments.

FIG. 7E shows an graphenated AAO substrate with a multi-layered graphite layer, after a thinning stage. The graphenated AAO substrate of FIG. 7E may comprise a monolayer of graphene film on the AAO substrate.

Figure 8:
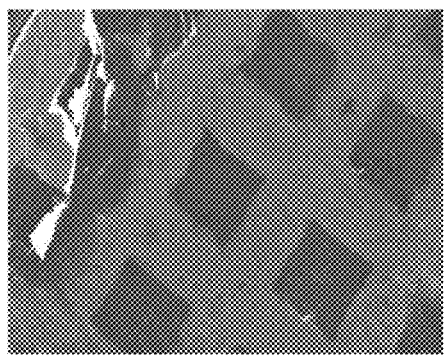
FIG. 8 depicts a SEM image of an example graphenated substrate that may be formed using a copper screen substrate.

FIG. 8 depicts a SEM image of an example graphenated substrate that may be formed using a copper screen substrate, in accordance with at least some embodiments of the present disclosure. In some embodiments, substrates may comprise copper screens with any of a variety of properties. An example copper screen may for example be of a type that may be used as an infrared (IR) filter. In some embodiments, free-standing copper screens may be used.

Copper screen substrates may comprise a selected thickness, periodicity, and opening size. For example, a thickness of about 5 μm, a periodicity of about 15 μm, and opening sizes of about 8 μm may be appropriate for some embodiments.

Graphenated substrates comprising copper screen substrates may be produced without the use of an annealing stage in some embodiments. Graphenated substrates produced using copper screens may be sonicated for a selected duration. For example, sonication for about two (2) minutes in ethanol may be appropriate in some embodiments. Sonication may be used to remove excessive layers of HOPG.

Graphenated substrates comprising copper screen substrates may be produced with one or more layers of graphene film. For example, the graphenated substrates depicted in FIG. 8 may comprise a three to four layer thick graphene film on a copper screen substrate.

As described above, graphene films and graphenated substrates formed according to at least some of the technologies disclosed herein may be measured and tested for selected properties, and may furthermore be characterized and/or classified according measured properties. In some embodiments, Raman spectroscopy may be used to measure and characterize graphene films. Raman spectroscopy may generally comprise orienting a graphene film sample at a selected angle and directing a laser at the sample. Raman spectra may be measured as a function of angle.

Figure 9:
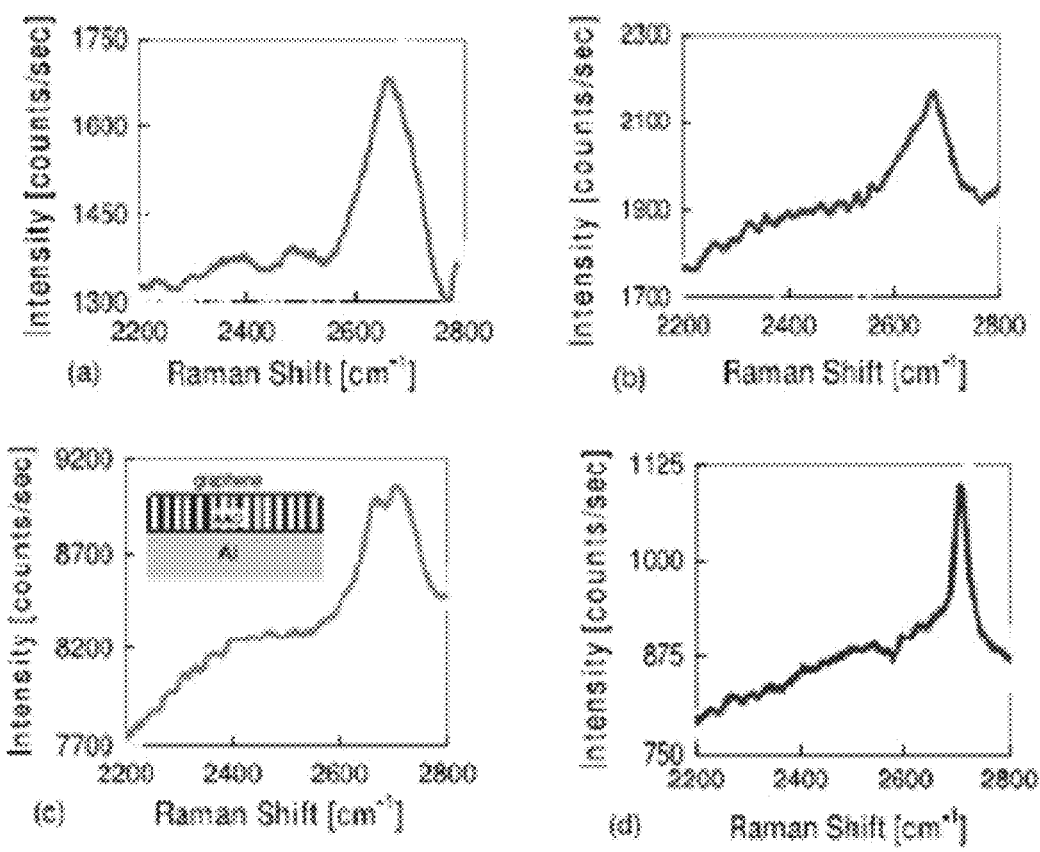
FIG. 9 depicts example Raman spectra which may characterize certain graphenated substrates.

FIG. 9 depicts example Raman spectra which may characterize certain graphenated substrates, in accordance with at least some embodiments of the present disclosure. FIG. 9 depicts unprocessed Raman spectra of (a) two-layer graphene on a silicon substrate; (b) a 2-3-layer graphene bridge; (c) two-layer graphene on an AAO substrate, where peak splitting is visible; and (d) 3-4 layer graphene on a copper screen.

FIG. 9 depicts four graphs, labeled (a), (b), (c), and (d). Each graph includes intensity measurements along a y axis and corresponding Raman shift values along an x axis. As stated above, graph (a) shows unprocessed Raman spectra of a two-layer graphene on a silicon substrate; graph (b) shows unprocessed Raman spectra of a 2-3-layer graphene bridge; graph (c) shows unprocessed Raman spectra of two-layer graphene, on an AAO substrate, where peak splitting is visible; and graph (d) shows unprocessed Raman spectra of a 3-4 layer graphene on a copper screen.

In some embodiments, peak positions for a layered graphene may be used to characterize a graphenated substrate. Graphenated substrates characterized by the illustrated Raman spectra and/or peak positions are disclosed in FIG. 9. In some embodiments graphenated substrates disclosed herein may be characterized by two innermost Raman peak positions for a double-layered graphene may comprise frequencies of about 2683 inverse centimeters ($cm^{-1}$) and about 2702 $cm^{-1}$, respectively. As can be seen from FIG. 9, the peak positions are in a range from about 2600 $cm^{-1}$ to about 2800 $cm^{-1}$.

In embodiments in which the peaks may be difficult to resolve, data processing comprising curve fitting may be applied to resolve the peaks. Curve fitting may be configured to assume a set of multiple peak positions, and electronically select peak position properties for the multiple peak positions that fit the experimental data. In other embodiments, the peaks may be distinctive for each of two or more layers of graphene, and curve fitting may be unnecessary. With reference to FIG. 9, curve fitting may be used to resolve the peaks illustrated in graphs (a) and (b). In contrast, graph (c) illustrates an embodiment corresponding to a graphenated AAO substrate in which the peaks may become clearly visible without curve fitting.

Raman spectra and/or peak positions may be used to characterize both mono-layered and multilayered graphene films and graphenated substrates. FIG. 9 illustrates that a D'Raman peak may shift to lower frequencies and may somewhat increase as a function of a reduced number of graphene layers. Graphene films and graphenated substrates comprising any number of layers may be measured using Raman spectroscopy and characterized by their distinct Raman signature.

In some embodiments, testing graphenated substrates may result in better resolution in embodiments comprising graphenated AAO substrates. Better resolution in graphenated AAO substrates may result from a unique electric field distribution in AAO substrates. For example, electric field intensity in a hole array of an AAO substrates may be concentrated within each hole at an oxide/air interface. Such an electric field distribution may be viewed as an organized array of 'hot-spots'. The graphene may be used as a platform to hold molecules at the top of a hole and the 'hot-spots' may be used to trigger a chemical reaction at well-prescribed hole locations. Without being limited by theory, it is expected that the intensity of Raman spectra depends on the orientation of the hole array with respect to an incidence laser beam, which may be characterized as a function of tilt angle and laser polarization. The graphene films formed in above embodiments may be tilted and rotated to achieve incident resonance conditions.

In some embodiments, suspended graphene films over copper screen substrate openings may be characterized by Raman spectra such as illustrated in graph (d). In embodiments in which copper screen openings are of relatively large size, the transparent nature of graphenated film and large opening size may be leveraged during testing by allowing for locating an opening and establishing substrate orientation under a microscope.

A Raman line of embodiments characterized by measurements such as illustrated in graph (d) may be narrow when compared to Raman lines of embodiments associated with graph (a) and graph (b). In the spectral region of graph (d), three-layer graphene exhibits a few close Raman lines. In some embodiments, when testing a graphenated substrate, Raman lines such as illustrated in graph (d) may be accentuated by a resonating effect of a copper screen substrate. Thus, similarly to the AAO substrates, Raman peak intensity of graphenated copper screen substrates may depend on the orientation of the screen openings with respect to the polarization direction of the incident beam in some embodiments and the orientation of the screen openings may be adjusted or otherwise accounted for during testing.

Figure 10:
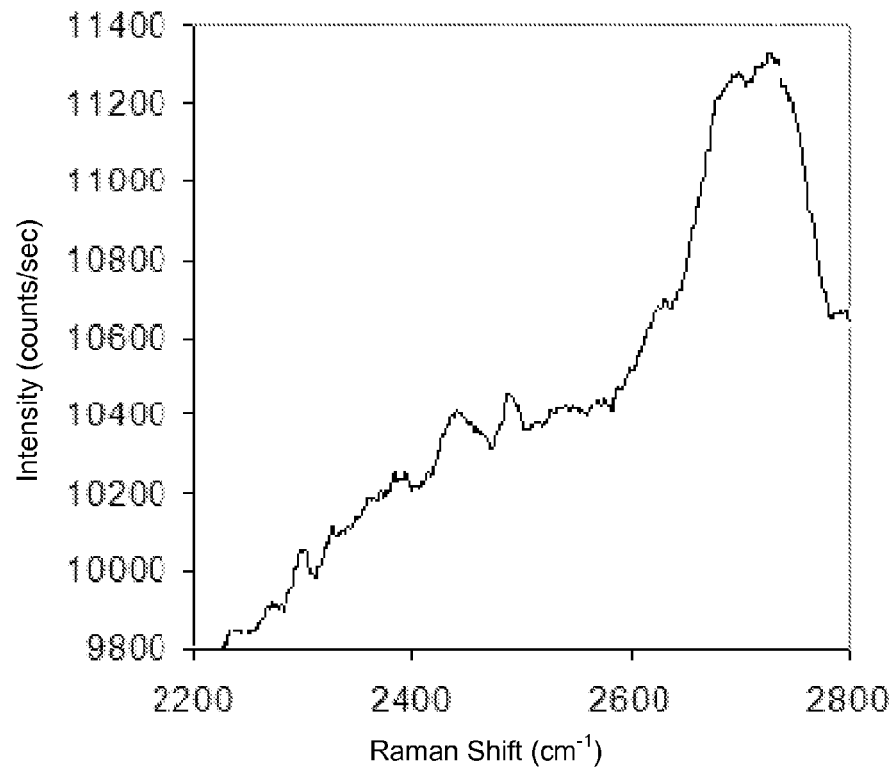
FIG. 10 depicts example Raman spectra which may characterize certain graphenated substrates.

FIG. 10 depicts example Raman spectra which may characterize certain graphenated substrates, in accordance with at least some embodiments of the present disclosure. FIG. 10 depicts a graph of intensity versus Raman shift, similar to the graphs of FIG. 9. In some embodiments, FIG. 10 may correspond to Raman spectra of an example three-layer graphene on an AAO substrate. As illustrated, the measured Raman spectra of such an embodiment may be characterized by two inmost peak positions, a first peak position around 2688 $cm^{-1}$ and a second peak position around 2722 $cm^{-1}$, respectively.

Figure 11:
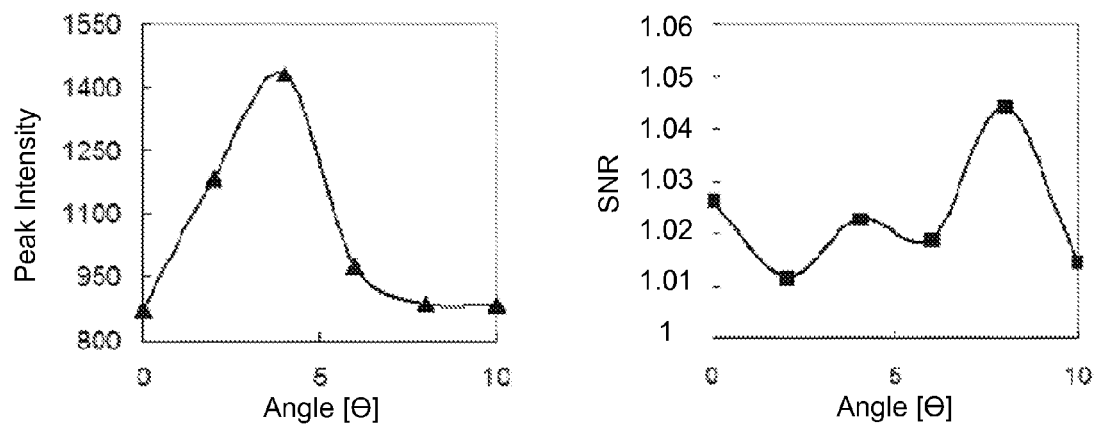
FIG. 11 depicts graphs displaying peak intensity and signal to noise ratio (SNR) as a function of tile angle.
Figure 12:
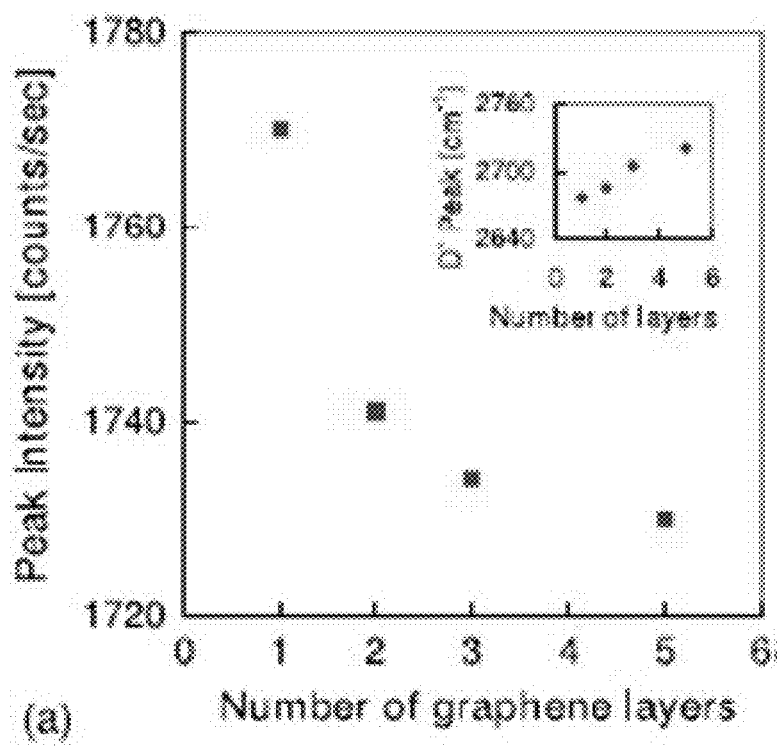
FIG. 12A depicts a graph illustrating a relationship between spectroscopy measurements and a number of graphene layers.
FIG. 12B shows bandpass properties of example graphenated substrates.
Figure 12:
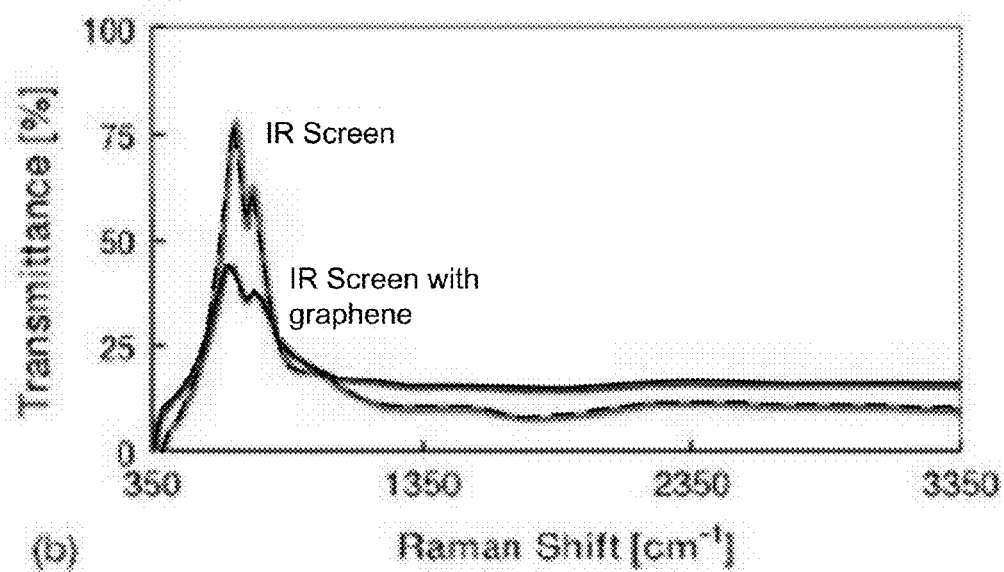

FIG. 11 depicts graphs displaying peak intensity and signal to noise ratio (SNR) as a function of tile angle in accordance with at least some embodiments of the present disclosure. SNR may be a better criterion to judge Surface Enhanced Raman Spectroscopy (SERS) amplification factor in some embodiments, because the signal level as well as the noise level might change under various pump conditions. FIG. 11 illustrates enhanced peak intensities at certain tilt angles, which may be used to characterize a graphenated substrate produced using the technologies described herein. FIG. 11 illustrates enhanced peak intensities at a 4° tilt in the left graph, and the enhancement of SNR is observed to peak at around 8° due to resonance for the excitation wavelength at about 514.5 nm. A small peak in SNR around 4° may be due to coupling of a scattered wavelength of around 2700 $cm^{-1}$ to the (6, 0) plane of hole array.

FIG. 12A depicts a graph illustrating a relationship between spectroscopy measurements and a number of graphene layers, in accordance with at least some embodiments of the present disclosure. In FIG. 12A, a vertical axis represents measured D'Raman peak intensity, and a horizontal axis represents a number of graphene layers. As can be seen in FIG. 12A, the peak intensities may be progressively lower as the number of graphene layers increase. Thus, in some embodiments graphenated substrates may be classified according to a measured D'Raman peak intensity, and the peak intensity may be correlated to a number of graphene layers. Furthermore, graphenated substrates are provided which comprise the illustrated correlations of peak intensities and numbers of layers. In FIG. 12A, the inset shows the shift in the graphene peak as a function of a number of layers.

In some embodiments, testing may comprise determining a number of layers of graphene based on peak intensity using correlations such as illustrated in FIG. 12A. For example, a curve similar to FIG. 12A along peak intensity measurements may be used to determine that a bridge such as illustrated in FIG. 6D may be made of 2-3 layers of graphene.

FIG. 12B shows bandpass properties of example graphenated substrates, in accordance with at least some embodiments of the present disclosure. FIG. 12B illustrates a graph comprising a vertical axis measuring transmittance, and a horizontal axis measuring Raman shift. Lines plotted on FIG. 12B show bandpass properties of a copper screen (dotted curve), and bandpass properties of a graphenated substrate comprising a copper screen topped with 3-4 layers of suspended graphene (solid line curve). The double peaks in the curves may result from a local polarization state, which may be within a plane of incidence (H- or p-polarization state). As can be seen from FIG. 12B, bandpass properties may be measured in some embodiments, and measured values may be used to characterize graphenated substrates. Also, graphenated substrates comprising the illustrated bandpass properties are disclosed.

Free-standing metal screens with an array of openings (also known as inductive screens or metal mesh Filters) exhibit a typical transmission frequency band pass. The deposition of 3-4 layers of graphene on a copper screen substrate may result in overall attenuated transmission and roughly 15 $cm^{-1}$ shift of the resonance frequency, as illustrated in FIG. 12B. Such relatively large impact may be due to the high conductivity and good quality of the graphene samples produced according to the disclosed techniques, despite the fact that graphite may lack specific absorption lines in the 2.5-25 μm region.

Figure 13:
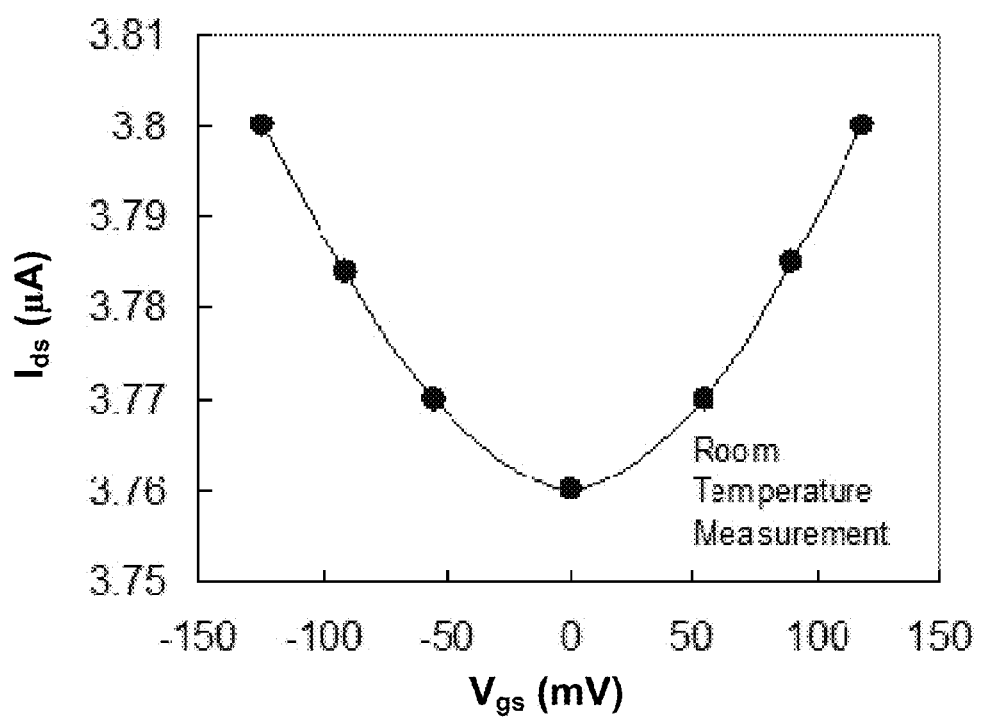
FIG. 13 represents drain to source current ($I_{ds}$) as a function of gate voltage ($V_g$) for example graphenated substrates.

FIG. 13 represents drain to source current ($I_{ds}$) as a function of gate voltage ($V_g$) for example graphenated substrates, in accordance with at least some embodiments of the present disclosure. Testing a graphenated substrate may comprise applying selected drain-to-source potential differences across electrodes, and measuring current passing through the graphenated substrate. Current measurements may be performed at a constant temperature, e.g., room temperature. A tested graphenated substrate may be characterized by a current measurements signature. Graphenated substrates characterized by the illustrated current measurements are disclosed herein.

FIG. 14 is a schematic diagram of an example Field Effect Transistor (FET) 1400 comprising a graphenated substrate, in accordance with at least some embodiments of the present disclosure. A FET 1400 may comprise an aluminum (Al) substrate 1401 which may also serve as a gate electrode 1413, an AAO insulator layer 1402, one or more layers of graphene 1403, a source contact region 1411, and drain contact region 1412.

In FIG. 14, the AAO insulator layer 1402 is depicted in contact with the Al substrate 1401. The one or more layers of graphene 1403, source contact region 1411, and drain contact region 1412 are depicted in contact with the AAO insulator layer 1402, with source contact region 1411 to one side, drain contact region 1412 opposite the source contact region 1411, and graphene 1403 extending between the source contact region 1411 and drain contact region 1412. The source contact region 1411 and gate electrode 1413 may be coupled via couplings 1420 to reference voltage 1421.

In some embodiments, a constant voltage may be applied between the contact regions 1411 and 1412, for example by connecting drain contact region 1412 to a voltage source while connecting source contact region 1411 to a reference voltage 1421. The gate electrode 1413 may provide a variable potential bias, for example by coupling a voltage source to the gate electrode 1413 and adjusting a variable resistor disposed between the voltage source and the aluminum substrate, although a variety of other configurations for providing a variable potential bias are possible, as will be appreciated. The current between the source and drain contact regions 1411 and 1412 ($I_{ds}$) may be monitored as a function of the gate-voltage, $V_g$. Some embodiments may produce results such as illustrated in FIG. 13.

In some embodiments, a FET 1400 may be made with graphene 1403 on substrates and insulator materials of other materials and configurations. For example, any metallic substrate may be substituted in some embodiments, and the insulator material may comprise any porous material disposed between the graphene 1403 and the substrate.

In some embodiments, boundaries between graphene 1403 and contact regions 1411 and 1412 may comprise a low-work function boundary material such as palladium (Pd) or gold (Au). Furthermore, graphene 1403 may be doped with one or more other materials in some embodiments to achieve desired properties, such as, for example to simulate a threshold voltage in the graphene 1403 as is commonly found in semiconductor materials.

Mobility (μ) for a FET such as illustrated in FIG. 14 may be assessed through conductivity (σ) at a given drain to source current ($I_{ds}$) and gate voltage ($V_{gs}$). Here, calculated conductivity may be determined by a ratio of the derivatives of $I_{ds}$ and $V_{gs}$. The mobility may be calculated as, μ=σ/en, where e is the electric charge ($1.6022 \times 10^{-19}$ C) and n is the carrier density of the graphene (e.g., around $10^{10}/cm^2$). The mobility may be compared with known or postulated mobility values for graphene. One known mobility value for graphene is around 2500 square centimeters per Volt-second ($cm^2$/V-s), and values may be significantly higher.

In conclusion, graphene may be deposited on solid and perforated substrates alike by use of techniques disclosed herein. Monolayers and multiple monolayers of high-quality, stress-free graphene may be systematically obtained. Graphene and graphenated substrates may be tested for example by measuring their related Raman spectra. Embodiments of the graphene films and graphenated substrates disclosed herein may find beneficial uses in a range of applications, including but not limited to Raman and IR spectroscopy of suspended molecules, optical transducers, and electrically driven chemical reactions at well-organized substrate locations. A range of graphenated substrates are disclosed, including for example graphenated AAO substrate exhibiting an amplified D'Raman line and clear peak splitting for a two-layer graphene.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While certain example techniques have been described and shown herein using various methods, devices and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

The invention claimed is:

1. A method to form a graphene film on a surface of a substrate, the method comprising:
depositing, by writing, graphite on the surface of the substrate to provide a graphite layer on the surface; and
polishing the graphite layer to provide the graphene film on the surface, the graphene film comprising a noncylindrical monolayer that is coplanar with the surface of the substrate.

2. A method according to claim 1, further comprising annealing the graphite layer prior to polishing the graphite layer.

3. A method according to claim 2, wherein annealing the graphite layer comprises adjusting an annealing temperature to a range between about 300° C. and about 900° C.

4. A method according to claim 2, wherein annealing the graphite layer comprises adjusting an annealing temperature to a range between about 800° C. and about 900° C.

5. A method according to claim 2, wherein annealing the graphite layer comprises adjusting an annealing temperature to a range between about 400° C. and about 500° C.

6. A method according to claim 2, wherein annealing the graphite layer comprises providing an annealing atmosphere including oxygen.

7. A method according to claim 2, wherein annealing the graphite layer comprises providing an annealing atmosphere including argon (Ar).

8. A method according to claim 2, wherein annealing the graphite layer comprises providing an annealing atmosphere characterized by about 100 standard cubic centimeters per minute (sccm) of argon (Ar).

9. A method according to claim 1, wherein depositing the graphite comprises depositing highly oriented pyrolytic graphite (HOPG) on the surface of the substrate.

10. A method according to claim 1, wherein depositing the graphite comprises depositing the graphite on the surface of the substrate in a selected pattern to provide the graphite layer, which has the selected pattern on the surface.

11. A method according to claim 1, wherein depositing the graphite comprises depositing the graphite in at least one contiguous graphene layer of 10,000 square micro-meters ($\mu m^2$) or larger.

12. A method according to claim 1, wherein polishing the graphite layer comprises sonicating the graphite layer in an organic solution.

13. A method according to claim 1, wherein polishing the graphite layer comprises sonicating the graphite layer in an organic solution comprising ethanol.

14. A method according to claim 1, further comprising:
fixing the substrate on a 2D translational stage; and
translating the 2D translational stage to a position;
wherein depositing the graphite on the surface of the substrate includes contacting the graphite with the surface of the substrate at the position.

15. A method according to claim 14, further comprising dynamically translating the 2D translational stage to additional positions according to a selected pattern such that the graphite layer is formed in the selected pattern on the surface of the substrate.

16. A method according to claim 1, wherein the surface of the substrate comprises one or more of a solid surface and/or a perforated surface.

17. A method according to claim 1, wherein the substrate comprises one or more of silicon (Si), anodized aluminum oxide (AAO), and/or copper (Cu).

18. A method according to claim 1, further comprising oxidizing the surface of the substrate prior to depositing the graphite on the surface.

19. A method according to claim 1, further comprising testing the graphene film using Raman spectroscopy.

20. A method according to claim 19, wherein testing comprises evaluating Raman spectra intensity peaks corresponding to a plurality of layers of graphene film on the surface of the substrate.

21. A method according to claim 1, further comprising arranging one or more electrodes on the substrate.

\* \* \* \* \*